(12) United States Patent
Sawai et al.

(10) Patent No.: US 6,448,690 B2
(45) Date of Patent: Sep. 10, 2002

(54) PIEZOELECTRIC RESONATOR

(75) Inventors: Kazuhiro Sawai; Ryuhei Yoshida, both of Toyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/749,866

(22) Filed: Dec. 28, 2000

(30) Foreign Application Priority Data

Jan. 20, 2000 (JP) .......................................... 2000-012006

(51) Int. Cl.[7] .............................................. H01L 41/04
(52) U.S. Cl. .......................................... 310/320; 310/365
(58) Field of Search .................................. 310/320, 333, 310/348, 365

(56) References Cited

U.S. PATENT DOCUMENTS

| | | | | |
|---|---|---|---|---|
| 5,117,147 A | * | 5/1992 | Yoshida | 310/320 |
| 5,350,965 A | * | 9/1994 | Noto et al. | 310/320 |
| 5,532,542 A | * | 7/1996 | Yoshida et al. | 310/321 |
| 6,014,799 A | * | 1/2000 | Kaida | 29/25.35 |
| 6,114,801 A | * | 9/2000 | Tanaka et al. | 310/312 |
| 6,133,673 A | * | 10/2000 | Kawara et al. | 310/320 |
| 6,163,101 A | * | 12/2000 | Yoshida et al. | 310/320 |
| 6,232,699 B1 | * | 5/2001 | Wajima | 310/320 |
| 6,333,591 B1 | * | 12/2001 | Yoshio et al. | 310/365 |

* cited by examiner

Primary Examiner—Nestor Ramirez
Assistant Examiner—Peter Medley
(74) Attorney, Agent, or Firm—Keating & Bennett, LLP

(57) ABSTRACT

An energy-trap type piezoelectric resonator utilizes a fundamental wave of a thickness shear vibration mode and includes resonance electrodes provided on both main surfaces of a substantially rectangular piezoelectric plate so as to face each other with the piezoelectric plate disposed therebetween. An energy trap vibration portion including a portion of the piezoelectric plate where the resonance electrodes overlap each other is asymmetrical with respect to the center in the longitudinal direction of the piezoelectric plate.

20 Claims, 4 Drawing Sheets

PIEZOELECTRIC RESONATOR

BACKGROUND OF THE INVENTION

1. Field of the Invention

The present invention relates to an energy-trap type piezoelectric resonator and more particularly, to an energy-trap type piezoelectric resonator including a substantially rectangular piezoelectric plate and vibrating using a fundamental wave of a thickness shear vibration mode.

2. Description of the Related Art

Energy-trap type piezoelectric resonators utilizing a thickness shear vibration mode have been used as resonators and filters. In FIGS. 6A and 6B, a perspective view and a vertical sectional view of a conventional piezoelectric resonator are shown.

A piezoelectric resonator 51 contains a long and narrow rectangular piezoelectric plate 52. The piezoelectric plate 52 is made of a piezoelectric ceramic material, such as lead zirconate titanate based ceramic, and is polarized in the longitudinal direction.

A resonance electrode 53 is disposed on the upper surface of the piezoelectric plate 52 and a resonance electrode 54 is disposed on the lower surface. The resonance electrodes 53 and 54 are opposed to each other with the piezoelectric plate 52 disposed therebetween in the middle of the longitudinal direction of the piezoelectric plate 52. The resonance electrode 53 extends to one end in the longitudinal direction of the piezoelectric plate 52, and the resonance electrode 54 extends to the other end in the longitudinal direction of the piezoelectric plate 52.

In the conventional piezoelectric resonator 51, by applying an alternating electric field between the resonance electrodes 53 and 54, a fundamental mode of a thickness shear vibration is excited, and the fundamental mode is confined or trapped in a vibration portion where the resonance electrodes 53 and 54 are opposed to and overlap each other.

In the conventional piezoelectric resonator 51, the vibration portion is located in the middle of the longitudinal dimension of the piezoelectric resonator 52.

There are cases where the piezoelectric resonator 51 is constructed as a piezoelectric component in which lead terminals are joined to the resonance electrodes 53 and 54 and in which the piezoelectric component with the lead terminals joined thereto is covered with a finishing resin excluding the tip of the lead terminals. Also, there are cases where the piezoelectric resonator 51 is constructed as a piezoelectric component in which the piezoelectric resonator 51 is joined to a substrate of a case with a space provided over the substrate so as not to prevent the vibration portion from vibrating and in which the piezoelectric resonator 51 is covered by a metal cap.

In either structure, the piezoelectric resonator 51 is connected to the lead terminals or the electrodes on the substrate of a case by soldering. Accordingly, during packaging or hardening and contraction of the finishing resin, an external stress may be applied in the longitudinal direction of the piezoelectric plate 52. As a result, the polarization axis of the piezoelectric plate 52 is bent, and accordingly, unwanted ripples are generated in the frequency band between the resonant frequency and the antiresonant frequency.

Particularly, when the thickness of the piezoelectric plate 52 is reduced and the width of the piezoelectric plate 52 is reduced in order to realize a piezoelectric resonator 51 having a smaller size, the above-mentioned ripples are more easily generated. Because of this defect, the piezoelectric resonator 51 could not be reduced in size.

SUMMARY OF THE INVENTION

In order to overcome the problems described above, preferred embodiments of the present invention provide a piezoelectric resonator that is constructed to use a fundamental wave of a thickness shear vibration mode and such that, even if a stress is applied to a piezoelectric plate of the resonator, the generation of unwanted ripples between the resonant frequency and the antiresonant frequency is prevented and the piezoelectric resonator can be made much smaller that conventional resonators.

According to a preferred embodiment of the present invention, an energy-trap type piezoelectric resonator utilizing a fundamental wave of a thickness shear vibration mode includes a substantially rectangular piezoelectric plate which is polarized in the longitudinal direction, and first and second resonance electrodes disposed on first and second main surfaces of the piezoelectric plate and arranged to define an energy trap vibration section and to face each other with the piezoelectric plate disposed therebetween, wherein the energy-trap vibration section is arranged to be asymmetrical with respect to the center in the longitudinal direction of the piezoelectric plate.

In the piezoelectric resonator according to various preferred embodiments of the present invention, a relationship $3t \leq \Delta L \leq 5t$ is preferably satisfied, where L is the length of the piezoelectric plate, t is the thickness of the piezoelectric plate, and $\Delta L$ is the distance between the center in the longitudinal direction of the piezoelectric plate and the center in the longitudinal direction of the vibrator portion.

In the piezoelectric resonator according to various preferred embodiments of the present invention, the first resonance electrode is arranged to extend to one end in the longitudinal direction of the piezoelectric plate and the second resonance electrode is arranged to extend to the other end in the longitudinal direction of the piezoelectric plate.

In the piezoelectric resonator according to various preferred embodiments of the present invention, first and second lead terminals are electrically connected to the lead-out portions of the first and second resonance electrodes, respectively, and, excluding the tips of the first and second lead terminal, the rest of the piezoelectric resonator is covered by finishing resin such that a space is defined around the vibration section of the resonator so as not to prevent or hinder the vibration section from vibrating.

Other features, elements, characteristics and advantages of the present invention will become more apparent from the detailed description of preferred embodiments thereof with reference to the drawings.

DETAILED DESCRIPTION OF PREFERRED EMBODIMENTS

Hereinafter, the present invention will be described in further detail by way of preferred embodiments with reference to the accompanying drawings.

Figure 1A:
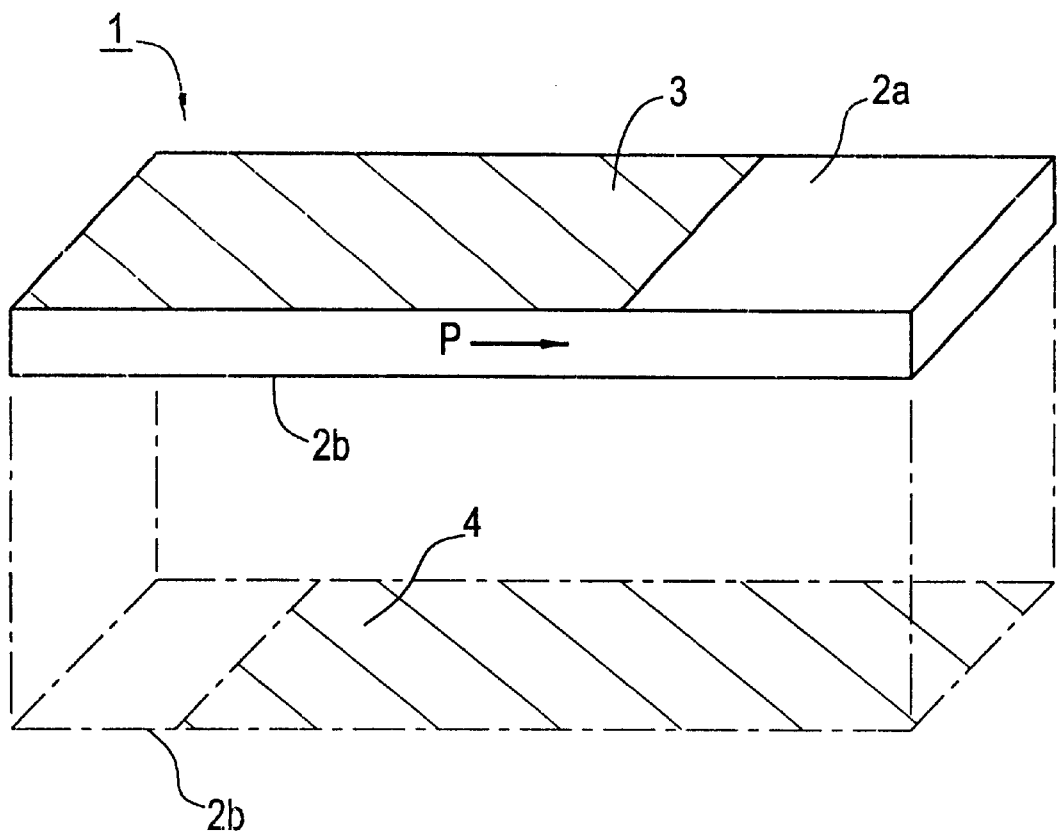
FIGS. 1A and 1B are a perspective view and a vertical sectional view of a piezoelectric resonator according to a preferred embodiment of the present invention.
Figure 1B:
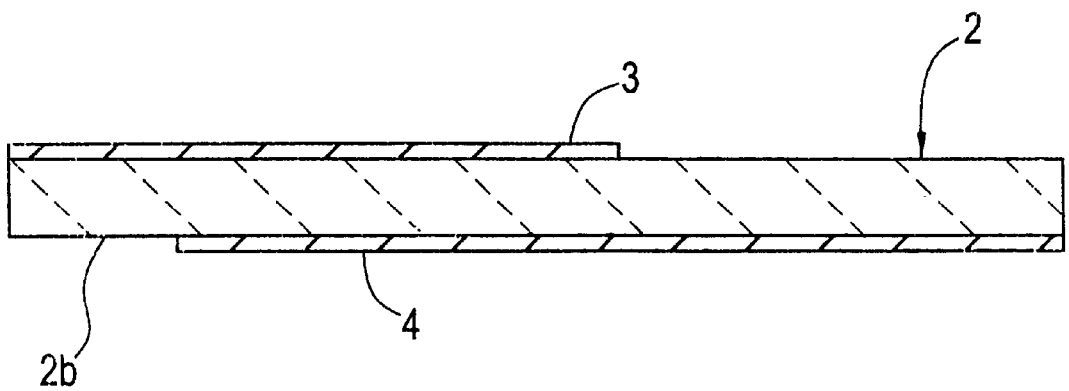

FIGS. 1A and 1B are a perspective view and a vertical sectional view which show a piezoelectric resonator according to a preferred embodiment of the present invention.

A piezoelectric resonator 1 is an energy-trap type piezoelectric resonator utilizing a fundamental wave of a thickness shear vibration mode.

The piezoelectric resonator 1 preferably includes a piezoelectric plate 2 that preferably has a long and narrow substantially rectangular shape. The piezoelectric plate 2 is preferably made of a piezoelectric ceramic material such as, for example, a lead zirconate titanate based ceramic material and is polarized in the direction P that is substantially parallel with the longitudinal direction of the piezoelectric plate 2.

A first resonance electrode 3 is disposed on the upper surface 2a of the piezoelectric plate 2. A second resonance electrode 4 is disposed on the lower surface 2b of the piezoelectric plate 2. The first and second resonance electrodes 3 and 4 are arranged to face and overlap each other with the piezoelectric plate 2 disposed therebetween. The portion of the plate 2 where the resonance electrodes 3 and 4 overlap each other with the piezoelectric plate 2 disposed therebetween constitutes an energy trap vibration portion.

The resonance electrode 3 is arranged to extend to one end in the longitudinal direction of the piezoelectric plate 2 from the above-mentioned vibration portion on the upper surface 2a of the piezoelectric plate 2. On the other hand, the resonance electrode 4 is arranged to extend to the other end in the longitudinal direction of the piezoelectric plate 2 from the vibration portion on the lower surface 2b.

The resonance electrodes 3 and 4 are preferably made of an appropriate metal material such as Ag, Ag—Pd alloy, Al, Cu, or other suitable material.

The piezoelectric resonator 1 of the present preferred embodiment is uniquely constructed such that the energy trap vibration section is asymmetrical with respect to the center in the longitudinal direction of the piezoelectric plate 2a. That is, the center portion of the resonator where the resonance electrode 3 and the resonance electrode 4 overlap each other is located closer to one end in the longitudinal direction of the piezoelectric plate 2 than the center in the longitudinal direction of the piezoelectric plate 2.

In the piezoelectric resonator 1 of the present preferred embodiment, because the energy trap vibration section is arranged to be located in a line on the side of one end from the center in the longitudinal direction of the piezoelectric plate 2, even if an external force is applied to the piezoelectric resonator 1 when the piezoelectric resonator 1 is packaged, or when resin finishing of the piezoelectric resonator 1 with lead terminals attached thereto takes place, in the frequency range between the resonant frequency and the antiresonant frequency of a piezoelectric resonator element as a final product, the generation of unwanted ripples can be effectively suppressed and prevented. This is specifically described with reference to FIGS. 2 to 5.

Figure 2:
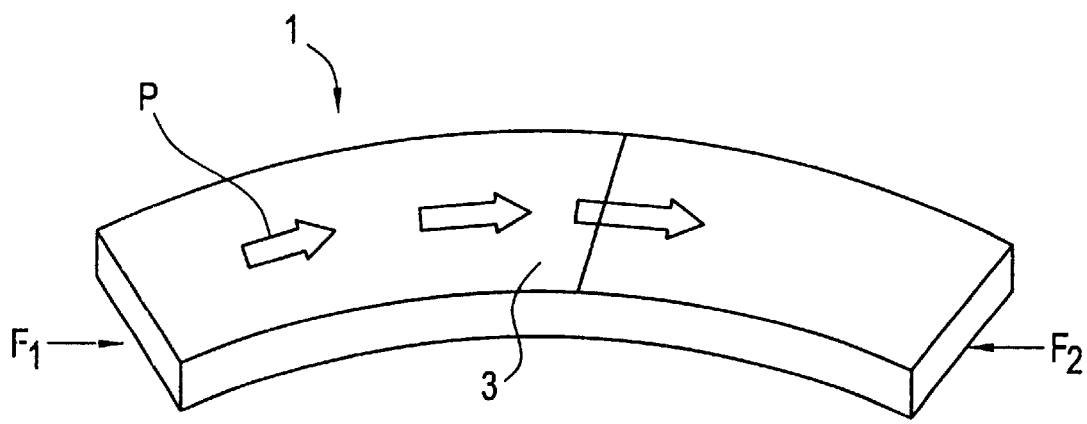
FIG. 2 is a schematic perspective view for illustrating the distortion of a polarization axis when a stress is applied in the longitudinal direction of a piezoelectric resonator.

When a piezoelectric resonator includes a piezoelectric resonator element having lead terminals attached thereto or when a piezoelectric resonator is mounted on a substrate of a case and is sealed by a cap so as to define a piezoelectric resonator device, because of stress imparted during hardening and contracting the resin used to define an outer package or because of stress applied by the connection portions during the packaging, generally the piezoelectric resonator 1 is warped. That is, as shown in FIG. 2, stresses $F_1$ and $F_2$ are applied, warping the piezoelectric resonator 1. In this case, the piezoelectric resonator 1 is warped, as shown by arrows P, and the polarization axis is also warped along the longitudinal direction of the piezoelectric plate 2.

Figure 3:
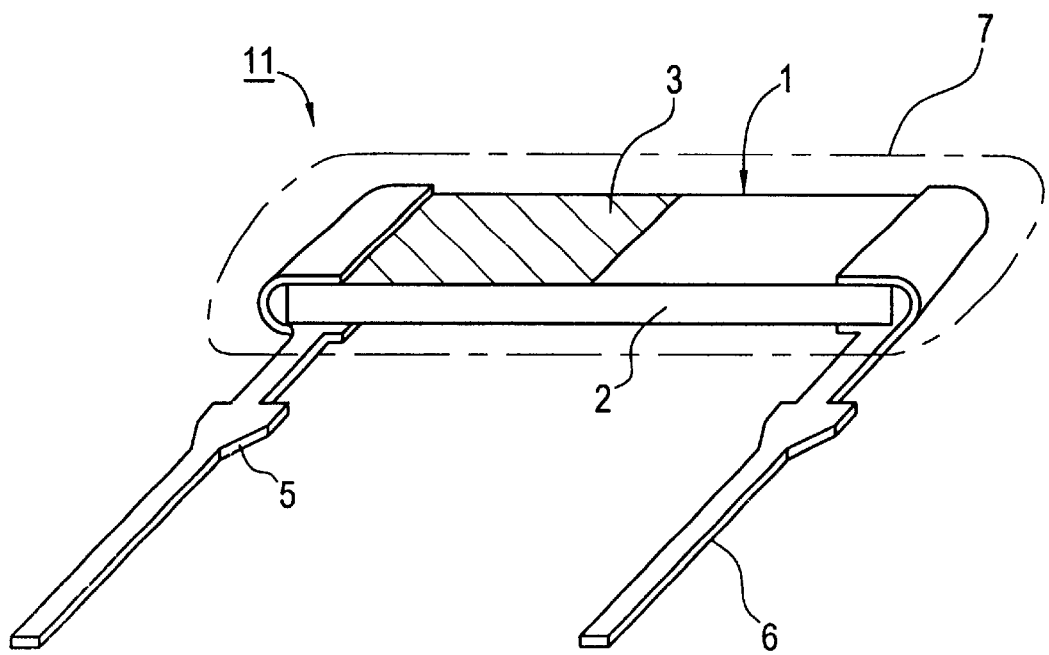
FIG. 3 is a schematic perspective view showing a piezoelectric resonator element with leads using a piezoelectric resonator according to a preferred embodiment of the present invention.

In a piezoelectric resonator element 11, for example, shown in FIG. 3, lead terminals 5 and 6 are connected to a piezoelectric resonator 1 and, excluding the tip portion of the lead terminals 5 and 6, the rest of the piezoelectric resonator part 11 is covered by a finishing resin 7. As such a finishing resin, generally, thermosetting resin such as epoxy resin, or other suitable material, is used and the material contracts when hardened. Accordingly, the above-mentioned stresses $F_1$ and $F_2$ are applied to the piezoelectric resonator 1.

Figure 5:
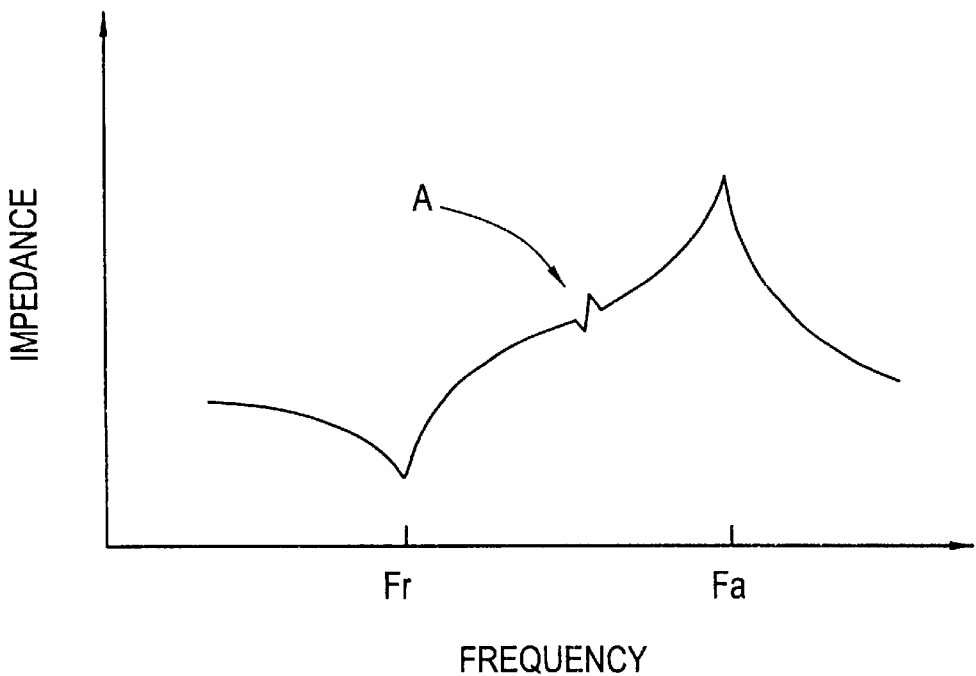
FIG. 5 is a diagram illustrating ripples generated in the frequency range between the resonant frequency and the antiresonant frequency in a piezoelectric resonator.
Figure 6A:
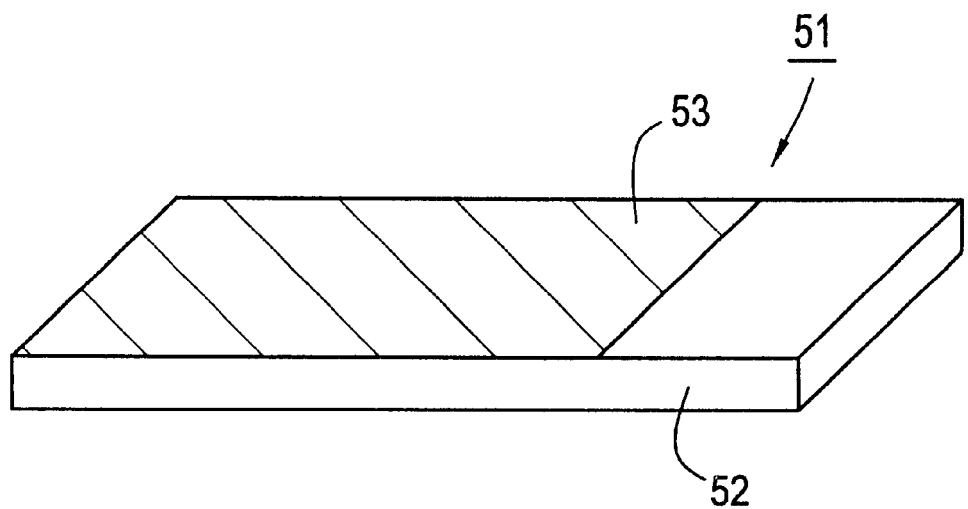
FIGS. 6A and 6B are a perspective view and a vertical sectional view, respectively, showing one example of conventional energy-trap type piezoelectric resonators.
Figure 6B:
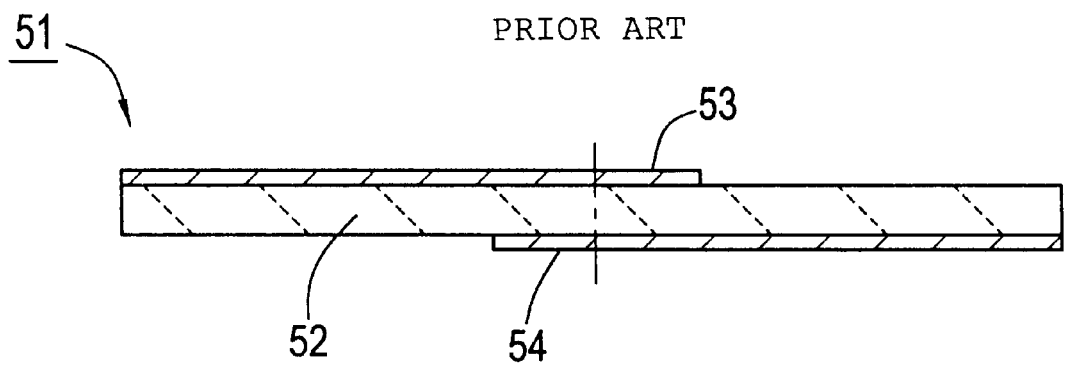

Therefore, in the conventional piezoelectric resonator 51, because the polarization axis p is also warped when the above-mentioned stresses are applied, unwanted ripples were likely to be generated between the resonant frequency and the antiresonant frequency as shown by an arrow A in FIG. 5.

The inventor of the present invention discovered that, when the application of the stress during the above-mentioned hardening and contraction of the finishing resin and the application of the stress at the packaging is considered, if in the piezoelectric resonator 1 the vibration section is constructed so as to suppress and minimize distortion of the polarization axis caused by the above-described stresses, the generation of unwanted ripples is prevented, and this finding has lead to development of various preferred embodiments of the present invention.

Figure 4:
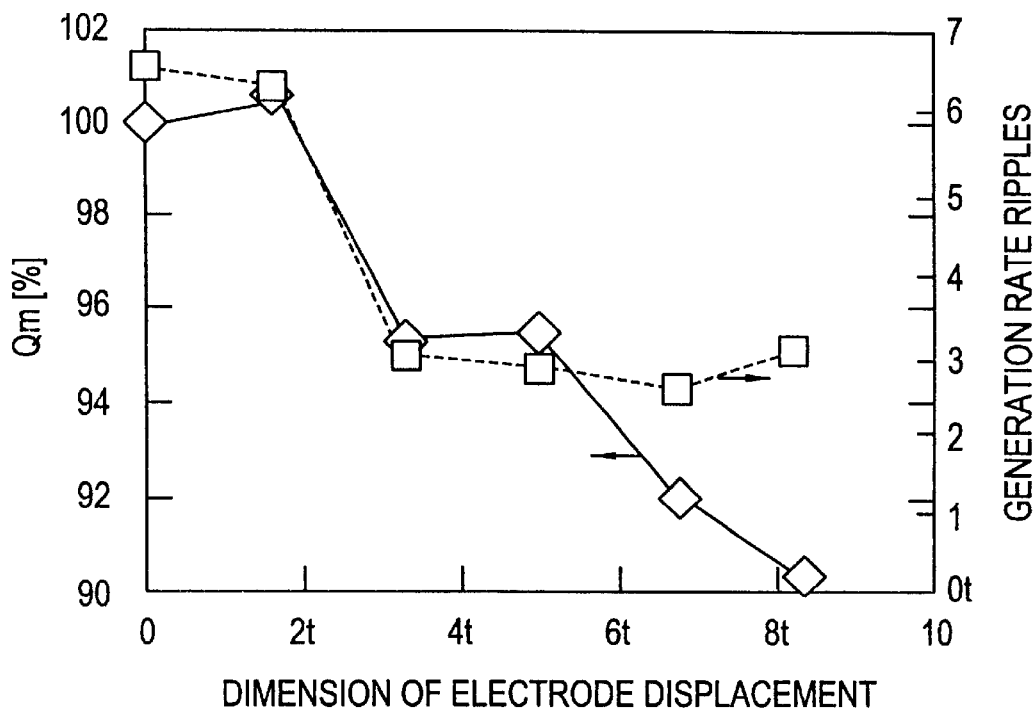
FIG. 4 shows the relationship between the generation rate of ripples and the mechanical factor of merit $Q_m$ relative to the dimension of electrode displacement showing the displacement of a piezoelectric vibrator portion from the center in the longitudinal direction of a piezoelectric plate.

FIG. 4 shows the change of $Q_m$ and of the generation rate of ripples, when the center of the vibrator portion is displaced toward the side of one end from the center in the longitudinal direction of the piezoelectric plate 2 in the piezoelectric resonator 1, based on the above-mentioned concepts. Moreover, in FIG. 4, the result of various piezoelectric resonators where resonance electrodes 3 and 4 are disposed on the upper and lower surfaces of the piezoelectric plate 2 having the approximate dimensions of 5.4×0.42× a thickness of about 0.12 mm and made of a lead zirconate titanate based ceramic material and where the resonance electrodes 3 and 4 are disposed in various locations, is shown. The dimensions of electrode displacement in the horizontal axis in FIG. 4 are defined as a distance $\Delta L$ between the center in the longitudinal direction of the piezoelectric plate 2 and the center of the vibration section along the longitudinal direction of the piezoelectric plate 2.

As is clearly seen in FIG. 4, when the vibration section is located at the center in the longitudinal direction of the piezoelectric plate 2, that is, when the dimension of electrode displacement is zero, the generation rate of ripples exceeds 6 percent. On the other hand, it is understood that by shifting the center of the vibration section toward the side of the end from the center in the longitudinal direction of the piezoelectric plate 2, the generation rate of ripples decreases. That is, as in the present preferred embodiment, by shifting the center of the vibration section toward the side of one end from the center in the longitudinal direction of the piezoelectric plate 2, that is, by constructing the vibration section so as to be asymmetrical about the center of the piezoelectric plate 2, it is understood that ripples which conventionally appear in the frequency area between the resonant frequency and the antiresonant frequency are effectively suppressed and prevented from occurring.

Moreover, regarding the generation rate of ripples of the vertical axis in FIG. 4, as in the impedance to frequency characteristic shown in FIG. 5, for example, in the frequency area between the resonant frequency Fr and the antiresonant frequency Fa, when a portion where the curve is not smoothly continuous, that is, in the portion where the area is not smoothly continuous, if the difference between the top and the bottom is larger than 0 dB, it is understood that a ripple is generated.

Furthermore, a mechanical factor of merit is also reduced when the dimension of electrode displacement is larger than zero as in the above.

Moreover, in the above-mentioned experimental example, a case where the vibration section was displaced toward the side of one end in the longitudinal direction of the piezoelectric plate 2 was described, but also in a case where the vibration section is displaced toward the side of the other end of the piezoelectric plate 2, the generation of ripples can be suppressed in the same way and that a mechanical factor of merit can be decreased.

As is clearly seen in FIG. 4, preferably, when a relationship $3t \leq \Delta L$ is satisfied, where L is the length of a piezoelectric plate 2, t is the thickness of the piezoelectric plate 2, and $\Delta L$ is a distance between the center in the longitudinal direction of the piezoelectric plate 2 and the center in the longitudinal direction of the vibrator portion, the generation rate of ripples is about 4% or less. Furthermore, when $\Delta L \leq 5t$, the decrease of a mechanical factor of merit $Q_m$ can be suppressed and prevented.

Therefore, it is preferable that the relationship $3t \leq \Delta L \leq 5t$ is satisfied.

In a piezoelectric resonator according to various preferred embodiments of the present invention, as described above, an energy trap vibration section utilizing a thickness shear vibration mode is asymmetrical with respect to the center in the longitudinal direction of a substantially rectangular piezoelectric plate which is polarized in the longitudinal direction, and accordingly, the generation of unwanted ripples between the resonant frequency and the antiresonant frequency is effectively suppressed and prevented. Therefore, when the resonator according to preferred embodiments of the present invention is used as a piezoelectric oscillator, for example, it is possible to provide a piezoelectric oscillator in which phenomena such as the skipping of oscillation, the stopping of oscillation, or other defects, can be certainly prevented and to provide an oscillator having superior reliability.

Furthermore, up to now, the above-mentioned piezoelectric resonators that generate ripples were considered to be defective products. However, according to preferred embodiments of the present invention, because the generation of unwanted ripples as described above is effectively prevented, the rate of acceptable products is greatly increased and accordingly, the cost of piezoelectric resonators is greatly reduced.

In various preferred embodiments of the present invention, when the relationship $3t \leq \Delta L \leq 5t$ is satisfied, the generation of ripples is prevented and the increase of a mechanical factor of merit $Q_m$ is prevented. Accordingly, the characteristics of the resonator when it is used as a piezoelectric oscillator, for example, are maintained while the generation of ripples is effectively prevented.

In various preferred embodiments of the present invention, when a first resonance electrode is arranged to extend out to one end in the longitudinal direction of a piezoelectric plate and a second resonance electrode is arranged to extend out to the other end in the longitudinal direction of the piezoelectric plate, in the same way as in conventional piezoelectric resonators utilizing a thickness shear vibration mode, an electrical connection and a mechanical support can be located at both ends of a piezoelectric resonator. Accordingly, a piezoelectric resonator element having leads attached thereto on which resin finishing has been performed, and a piezoelectric resonator element with a cap thereon which is mounted on a substrate of a case and is sealed by a cap, can be constructed.

While the invention has been particularly shown and described with reference to preferred embodiments thereof, it will be understood by those skilled in the art that the foregoing and other changes in form and details can be made without departing from the spirit and scope of the invention.

What is claimed is:

1. An energy-trap type piezoelectric resonator mode comprising:

a piezoelectric plate which is polarized in the longitudinal direction and includes first and second main surfaces; and first and second resonance electrodes disposed on the first and second main surfaces of the piezoelectric plate, respectively, such that the first and second electrodes overlap each other with the piezoelectric plate disposed therebetween so as to define an energy trap vibration section; wherein the energy trap vibration section is asymmetrical with respect to the center in the longitudinal direction of the piezoelectric plate.

2. The piezoelectric resonator according to claim 1, wherein the piezoelectric plate and the first and second resonance electrodes are arranged such that the resonator vibrates using a fundamental wave of a thickness shear vibration.

3. The piezoelectric resonator according to claim 1, wherein the piezoelectric plate is substantially rectangular.

4. The piezoelectric resonator according to claim 1, wherein a relationship $3t \leq \Delta L \leq 5t$ is satisfied, where L is the length of the piezoelectric plate, t is the thickness of the piezoelectric plate, and $\Delta L$ is a distance between the center in the longitudinal direction of the piezoelectric plate and the center in the longitudinal direction of the vibration section.

5. The piezoelectric resonator according to claim 1, wherein the first resonance electrode is arranged to extend to one end in the longitudinal direction of the piezoelectric plate and the second resonance electrode is arranged to extend to the other end in the longitudinal direction of the piezoelectric plate.

6. The piezoelectric resonator according to claim 1, wherein a first lead terminal and a second lead terminal are electrically connected to the lead-out portions of the first and second resonance electrodes, respectively, and wherein the remaining portion of the piezoelectric resonator except for tips of the first and second lead terminals is covered by resin such that a space is defined around the vibration section so as not to hinder the vibration section from vibrating.

7. The piezoelectric resonator according to claim 1, wherein the piezoelectric plate is made of a piezoelectric ceramic material and is polarized in a direction that is substantially parallel to the longitudinal direction of the piezoelectric plate.

8. The piezoelectric resonator according to claim 1, wherein the first and second resonance electrodes are made of one of Ag, Ag—Pd alloy, Al, and Cu.

9. The piezoelectric resonator according to claim 1, wherein the center portion of the resonator where the first and second resonance electrodes overlap each other is located closer to one end in the longitudinal direction of the piezoelectric plate than the center in the longitudinal direction of the piezoelectric plate.

10. An oscillator comprising:
    at least one piezoelectric resonator including:
        a piezoelectric plate which is polarized in the longitudinal direction and includes first and second main surfaces; and
        first and second resonance electrodes disposed on the first and second main surfaces of the piezoelectric plate, respectively, such that the first and second electrodes overlap each other with the piezoelectric plate disposed therebetween so as to define an energy trap vibration section; wherein
        the energy trap vibration section is asymmetrical with respect to the center in the longitudinal direction of the piezoelectric plate; and
    a case containing said at least one piezoelectric resonator.

11. An energy-trap type piezoelectric resonator mode comprising:
    a piezoelectric plate which is polarized in the longitudinal direction and includes first and second main surfaces; and
    first and second resonance electrodes disposed on the first and second main surfaces of the piezoelectric plate, respectively, such that the first and second electrodes overlap each other with the piezoelectric plate disposed therebetween so as to define an energy trap vibration section; wherein
    the center portion of the resonator where the first and second resonance electrodes overlap each other is located closer to one end in the longitudinal direction of the piezoelectric plate than the center in the longitudinal direction of the piezoelectric plate.

12. The piezoelectric resonator according to claim 11, wherein the piezoelectric plate and the first and second resonance electrodes are arranged such that the resonator vibrates using a fundamental wave of a thickness shear vibration.

13. The piezoelectric resonator according to claim 11, wherein the piezoelectric plate is substantially rectangular.

14. The piezoelectric resonator according to claim 11, wherein a relationship $3t \leq \Delta L \leq 5t$ is satisfied, where L is the length of the piezoelectric plate, t is the thickness of the piezoelectric plate, and $\Delta L$ is a distance between the center in the longitudinal direction of the piezoelectric plate and the center in the longitudinal direction of the vibration section.

15. The piezoelectric resonator according to claim 11, wherein the first resonance electrode is arranged to extend to one end in the longitudinal direction of the piezoelectric plate and the second resonance electrode is arranged to extend to the other end in the longitudinal direction of the piezoelectric plate.

16. The piezoelectric resonator according to claim 11, wherein a first lead terminal and a second lead terminal are electrically connected to the lead-out portions of the first and second resonance electrodes, respectively, and wherein the remaining portion of the piezoelectric resonator except for tips of the first and second lead terminals is covered by resin such that a space is defined around the vibration section so as not to hinder the vibration section from vibrating.

17. The piezoelectric resonator according to claim 11, wherein the piezoelectric plate is made of a piezoelectric ceramic material and is polarized in a direction that is substantially parallel to the longitudinal direction of the piezoelectric plate.

18. The piezoelectric resonator according to claim 11, wherein the first and second resonance electrodes are made of one of Ag, Ag—Pd alloy, Al, and Cu.

19. The piezoelectric resonator according to claim 11, wherein the energy trap vibration section is asymmetrical with respect to the center in the longitudinal direction of the piezoelectric plate.

20. An oscillator comprising:
    at least one piezoelectric resonator including:
        a piezoelectric plate which is polarized in the longitudinal direction and includes first and second main surfaces; and
        first and second resonance electrodes disposed on the first and second main surfaces of the piezoelectric plate, respectively, such that the first and second electrodes overlap each other with the piezoelectric plate disposed therebetween so as to define an energy trap vibration section; wherein
        the center portion of the resonator where the first and second resonance electrodes overlap each other is located closer to one end in the longitudinal direction of the piezoelectric plate than the center in the longitudinal direction of the piezoelectric plate; and
    a case containing said at least one piezoelectric resonator.

* * * * *